US012755923B2

(12) United States Patent
Adamec et al.

(10) Patent No.: US 12,755,923 B2
(45) Date of Patent: Oct. 6, 2026

(54) DEFLECTOR FOR A CHARGED PARTICLE BEAM APPARATUS, DEFLECTING SYSTEM, CHARGED PARTICLE BEAM APPARATUS, AND METHOD OF FABRICATING A DEFLECTOR

(71) Applicant: ICT Integrated Circuit Testing Gesellschaft für Halbleiterprüftechnik mbH, Heimstetten (DE)

(72) Inventors: Pavel Adamec, Haar (DE); Robert Zimmermann, Munich (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 362 days.

(21) Appl. No.: 18/511,767

(22) Filed: Nov. 16, 2023

(65) Prior Publication Data

US 2025/0166958 A1 May 22, 2025

(51) Int. Cl.

*H01J 37/147* (2006.01)
*H01J 37/153* (2006.01)
*H01J 37/28* (2006.01)

(52) U.S. Cl.

CPC ........ *H01J 37/1471* (2013.01); *H01J 37/153* (2013.01); *H01J 37/28* (2013.01); *H01J 2237/1532* (2013.01)

(58) Field of Classification Search

CPC ...... H01J 37/1471; H01J 37/153; H01J 37/28; H01J 37/1472; H01J 2237/141; H01J 2237/1532

See application file for complete search history.

(56) References Cited

U.S. PATENT DOCUMENTS

| | | | | | |
|---|---|---|---|---|---|
| 6,153,885 | A * | 11/2000 | Kendall | H01J 49/20 | 250/396 ML |
| 7,785,450 | B2 * | 8/2010 | Maget | C25B 1/00 | 204/266 |
| 7,786,450 | B2 * | 8/2010 | Zach | H01J 29/768 | 336/200 |
| 2007/0075262 | A1 * | 4/2007 | Winkler | H01J 37/1477 | 250/398 |
| 2014/0264062 | A1 * | 9/2014 | Adamec | H01J 37/1475 | 29/602.1 |
| 2020/0152414 | A1 * | 5/2020 | Nakano | H01J 37/153 | |

* cited by examiner

*Primary Examiner* — David E Smith
(74) *Attorney, Agent, or Firm* — Kilpatrick Townsend & Stockton LLP

(57) ABSTRACT

A deflector for a charged particle beam apparatus is described. The deflector has an axis and is configured to deflect a charged particle beam in a direction perpendicular to the axis, the deflector including a plurality of flat coils including two pairs of flat coils, wherein the two pairs of flat coils are arranged on opposite sides about the axis of the deflector.

18 Claims, 7 Drawing Sheets

DEFLECTOR FOR A CHARGED PARTICLE BEAM APPARATUS, DEFLECTING SYSTEM, CHARGED PARTICLE BEAM APPARATUS, AND METHOD OF FABRICATING A DEFLECTOR

TECHNICAL FIELD

Embodiments described herein relate to a deflector for deflecting a charged particle beam in a charged particle beam apparatus, for example in an electron microscope, particularly in a scanning electron microscope (SEM). Further, embodiments of the present disclosure relate to a deflecting system, a charged particle beam apparatus, and a method of fabricating a deflector.

BACKGROUND

Modern semiconductor technology has created a high demand for structuring and probing samples in the nanometer or even in the sub-nanometer scale. Micrometer and nanometer-scale process control, inspection or structuring, is often done with charged particle beams, e.g. electron beams, which are generated, shaped, deflected and focused in charged particle beam apparatuses, such as electron microscopes or electron beam pattern generators. For inspection purposes, charged particle beams offer a superior spatial resolution compared to, e.g., photon beams.

Apparatuses using charged particle beams, such as scanning electron microscopes (SEM), have many functions in a plurality of industrial fields, including, but not limited to, inspection of electronic circuits, exposure systems for lithography, detecting systems, defect inspection tools, and testing systems for integrated circuits. In such particle beam systems, fine beam probes with a high current density can be used. For instance, in the case of an SEM, the primary electron beam generates signal particles like secondary electrons (SE) and/or backscattered electrons (BSE) that can be used to image and/or inspect a sample.

In charged particle beam apparatuses, deflectors are usually used to deflect the charged particles relative to an optical axis. Conventional deflectors for instance, use saddle coils, toroidal coils or more complex wirings to deflect particle beams. However, providing deflectors for reliably inspecting and/or imaging samples at a good resolution and with small aberrations remains challenging. The reliable and reproducible production of complex deflection systems is challenging, causing noticeable deviations between individual deflectors.

In light of the above, providing an improved deflector, an improved deflecting system, an improved charged particle beam apparatus and an improved method of fabricating a deflector is beneficial.

SUMMARY

In light of the above, a deflector for deflecting a charged particle beam in a charged particle beam apparatus, a deflecting system, a charged particle beam apparatus, and a method of fabricating a deflector are provided. Further advantages, features, aspects and details that can be combined with embodiments described herein are evident from the dependent claims, the description and the drawings.

According to an embodiment, a deflector for a charged particle beam apparatus is provided. The deflector has an axis and is configured to deflect a charged particle beam in a direction perpendicular to the axis. The deflector includes a plurality of flat coils including two pairs of flat coils, wherein the two pairs of flat coils are arranged on opposite sides about the axis of the deflector.

According to an embodiment, a deflecting system for a charged particle beam apparatus is provided. The deflecting system is configured for deflecting a charged particle beam of the charged particle beam apparatus relative to an optical axis. The deflecting system includes a plurality of deflectors, each deflector of the plurality of deflectors having an axis and being configured to deflect the charged particle beam in a direction perpendicular to the axis. Each deflector includes a plurality of flat coils including two pairs of flat coils, wherein the two pairs of flat coils are arranged on opposite sides about the axis of the deflector.

According to an embodiment, a charged particle beam apparatus is provided. The charged particle beam apparatus includes a deflecting system configured for deflecting a charged particle beam of the charged particle beam apparatus relative to an optical axis. The deflecting system includes a plurality of deflectors for the charged particle beam apparatus, each deflector of the plurality of deflectors having an axis and being configured to deflect the charged particle beam in a direction perpendicular to the axis. Each deflector includes a plurality of flat coils including two pairs of flat coils, wherein the two pairs of flat coils are arranged on opposite sides about the axis of the deflector.

According to an embodiment, a method of fabricating a deflector for a charged particle beam apparatus is provided. The method includes arranging four flat coils as two pairs of flat coils of the deflector around an axis of the deflector, wherein the two pairs of flat coils are arranged on opposite sides about the axis.

BRIEF DESCRIPTION OF THE DRAWINGS

So that the manner in which the above recited features of the present disclosure can be understood in detail, a more particular description, briefly summarized above, may be had by reference to embodiments. The accompanying drawings relate to one or more embodiments and are described in the following.

DETAILED DESCRIPTION

Reference will now be made in detail to the various embodiments, one or more examples of which are illustrated in the figures. Within the following description of the drawings, same reference numbers refer to same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

Embodiments of the present disclosure provide a deflector for a charged particle beam apparatus, wherein the deflector includes flat coils. In comparison to deflectors including other types of coils such as saddle coils or toroidal coils, flat coils can be manufactured more easily and/or with lower tolerances. In embodiments, the flat coils may be arranged independently to reduce aberrations. In embodiments of the present disclosure, providing deflectors based on flat coils may reduce costs of production, reduce aberrations, improve performance of a beam separation between a primary charged particle beam and a signal charged particle beam, and/or improve a matching between manufactured charged particle beam apparatuses.

Figure 1:
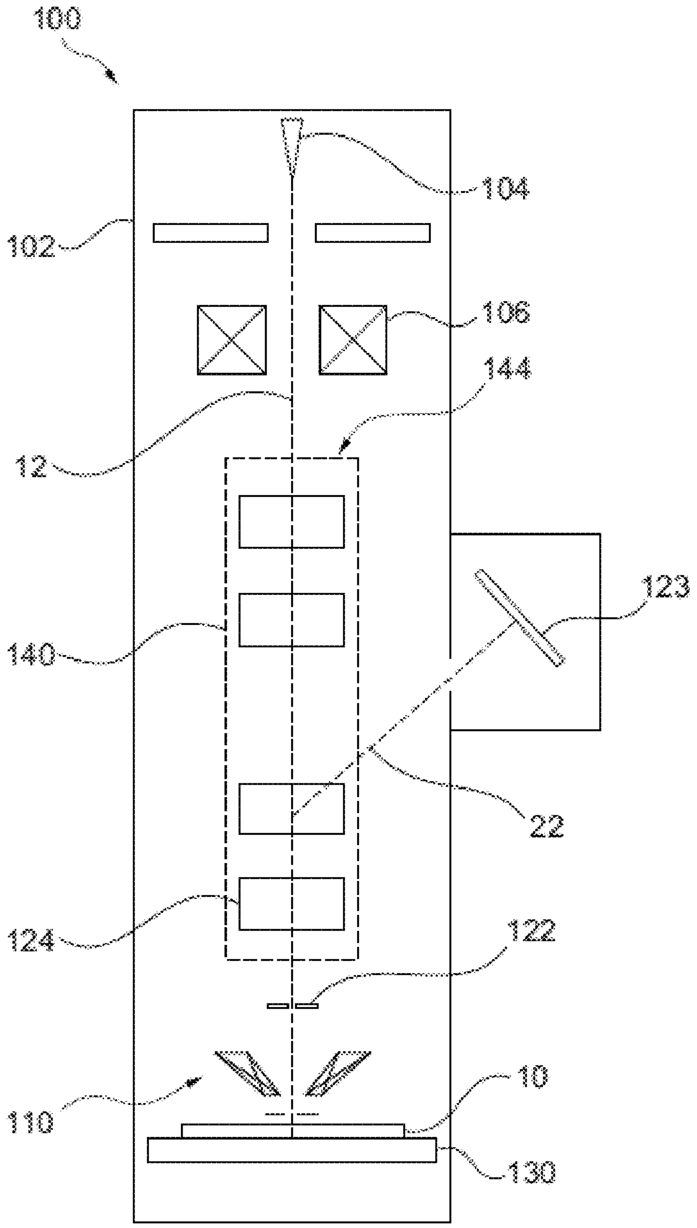
FIG. 1 shows a schematic view of a charged particle apparatus according to embodiments described herein.

FIG. 1 is a schematic view of a charged particle beam apparatus 100. In particular, the charged particle beam apparatus 100 may be configured for inspecting and/or imaging a sample 10 or portions of a sample. The charged particle beam apparatus 100 includes a column 102. The column 102 can provide a vacuum enclosure such that the charged particle beam travels under vacuum. The beam-optical components of the charged particle beam apparatus 100 can be placed in a vacuum chamber of the column 102 that can be evacuated. A vacuum can be beneficial for propagation of the charged particle beam, for example, along the optical axis 12 from the charged particle beam source 104 toward the sample stage 130. The charged particle beam may hit the sample under a sub-atmospheric pressure, e.g. a pressure below $10^{-3}$ mbar or a pressure below $10^{-5}$ mbar.

The charged particle beam apparatus 100 includes a charged particle beam source 104. A charged particle beam source can be configured to emit a charged particle beam. The charged particle beam may be an electron beam. The charged particle beam may propagate along an optical axis 12. The charged particle beam apparatus 100 further includes a sample stage 130. An objective lens 110 focuses the charged particle beam, i.e., a primary charged particle beam, on the sample 10. The sample 10 can be placed on the sample stage 130.

A condenser lens 106 or a condenser lens system including one or more condenser lenses may be arranged downstream of the charged particle beam source 104. The condenser lens system can collimate the charged particle beam propagating toward the objective lens 110. Further, an electrode or tube (not shown) configured to accelerate the beam can be provided. The electrode or tube can be provided on a high potential. The high potential can, for example, be a high positive potential relative to the charged particle beam source to accelerate an electron beam. The electrode or tube may provide an acceleration section for accelerating the electron beam, e.g., to an electron energy of 5 keV or more. The electrons may be first accelerated by an extractor electrode that is set on a positive potential relative to an emission tip of the charged particle beam source 104. The electrode or tube may provide for further beam acceleration. In some embodiments, the charged particles, for example, electrons, are accelerated to an electron energy of 10 keV or more, 30 keV or more, or even 50 keV or more. A high electron energy within the column can reduce negative effects of electron-electron interactions. A high beam energy within the charged particle beam apparatus can improve an imaging resolution.

The charged particle beam apparatus 100 can include one or more charged particle detectors, particularly two or more charged particle detectors such as two or more electron detectors. According to embodiments described herein, an on-axis detector 122 may be provided. Additionally or alternatively, an off-axis detector 123 can be provided. The on-axis detector and/or the off-axis detector can detect signal particles emitted or released from the sample 10. The signal electrons are emitted or released from the sample upon impingement of the primary charged particle beam on the sample. According to different modes of operation, the charged particle detectors can each detect high energy signal electrons or low energy signal electrons. For example, high energy signal electrons can be backscattered electrons (BSE) and low energy signal electrons can be secondary electrons (SE). According to different modes of operation, filtering of signal electrons depending on the energy of the signal electrons can be provided.

According to embodiments, which can be combined with other embodiments described herein, the column 102 includes a deflecting system 140 as described herein. In particular, the deflecting system may include one or more deflectors according to embodiments of the present disclosure. The deflectors may deflect the charged particle beam relative to the optical axis 12. For example, in FIG. 1, the deflecting system includes a plurality of deflectors 144. In particular, the deflecting system 140 includes a beam separator 124 to separate the signal charged particle beam 22 from the primary charged particle beam traveling along the optical axis 12. The beam separator 124 can include a deflector according to embodiments described herein, specifically a magnetic deflector, wherein the beam deflection of the signal charged particle beam 22 away from the primary beam results from the signal charged particle beam traveling in the opposite direction as compared to the primary charged particle beam. The beam separator 124 can particularly direct the signal charged particle beam 22 towards the off-axis detector 123, for example as schematically illustrated in FIG. 1.

An image generation unit (not shown) may be provided. The image generation unit can be configured to generate one or more images of the sample 10. The image generation unit can generate the one or more images based on the signal received from the detectors. The image generation unit can forward the one or more images of the sample to a processing unit (not shown).

The sample stage 130 may be a movable stage. In particular, the sample stage 130 may be movable in the Z-direction, i.e., in the direction of the optical axis 12, such that the distance between the objective lens 110 and the sample stage 130 can be adjusted. By moving the sample stage 130 in the Z-direction, the sample 10 can be moved to different "working distances". Further, the sample stage 130 may also be movable in a plane perpendicular to the optical axis 12 (also referred to herein as the X-Y-plane). By moving the sample stage 130 in the X-Y-plane, a specified surface region of the sample 10 can be moved into an area, e.g. a field of view (FOV), below the objective lens 110, such that the specified surface region can be imaged by focusing the charged particle beam on the surface region of the sample.

For example, the charged particle beam apparatus 100 may be an electron microscope, particularly a scanning electron microscope. According to some embodiments, which can be combined with other embodiments described herein, a scan deflector (not shown) may be provided for scanning the charged particle beam, particularly over a surface of the sample 10 along a predetermined scanning pattern, for example, in the X-direction and/or in the Y-direction.

One or more surface regions of the sample 10 can be inspected and/or imaged with the charged particle beam apparatus 100. The term "sample" as used herein may also be referred to as the "specimen" and may relate to a substrate, for example, with one or more layers or features formed thereon, a semiconductor wafer, a glass substrate, a flexible substrate, such as a web substrate, or another sample that is to be inspected. The sample can be inspected for one or more of (1) imaging a surface of the sample, (2) measuring dimensions of one or more features of the sample, e.g. in a lateral direction, i.e. in the X-Y-plane, (3) conducting critical dimension measurements and/or metrology, (4) detecting defects, and/or (5) investigating the quality of the sample.

According to embodiments of the present disclosure, a deflector for a charged particle beam apparatus is provided. The deflector has an axis and is configured to deflect a charged particle beam in a direction perpendicular to the axis. The deflector includes a plurality of flat coils. According to embodiments, the plurality of flat coils includes two pairs of flat coils, wherein the two pairs of flat coils are arranged on opposite sides about the axis of the deflector. For instance, the deflector may be an electron beam deflector, particularly for an electron microscope such as a scanning electron microscope. In embodiments, the deflector is a magnetic deflector.

Figure 2A:
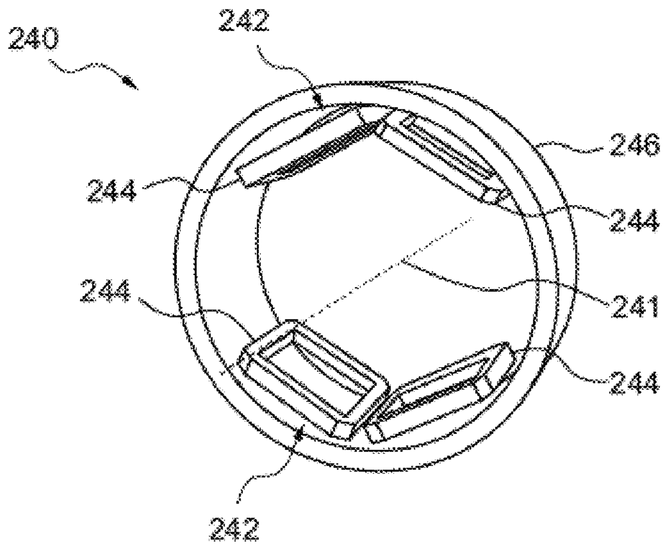
FIGS. 2*a* and 2*b* each show a schematic view of a deflector according to embodiments of the present disclosure.
Figure 2B:
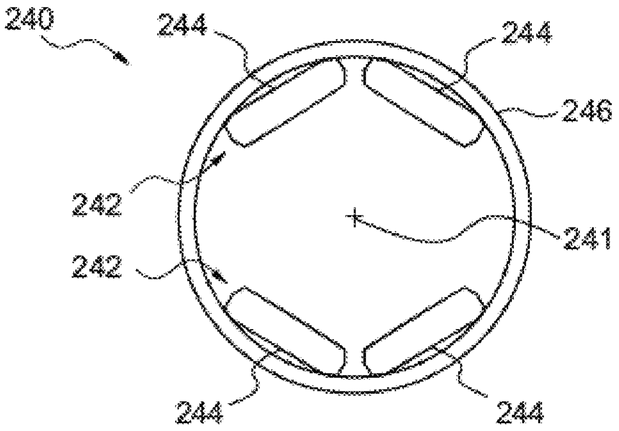

For example, FIGS. 2*a* and 2*b* illustrate a deflector 240 having two pairs 242 of flat coils 244 arranged on opposite sides about an axis 241 of the deflector 240. In embodiments, the flat coils of each pair of flat coils are arranged closer to each other than to the flat coils of the other pair of flat coils. The two pairs of flat coils may be held in position by a support (not shown). The support may be made from a non-magnetic material. In some embodiments, the support may allow for immobilizing individually positioned flat coils 244 as described herein.

In some embodiments, the flat coils 244 may be surrounded in the circumferential direction about the axis 241 by a casing 246 including or being made of a metal with high permeability, e.g. mu-metal. The casing 246 may be provided to contain and/or increase the magnetic field provided by the flat coils 244. For instance, the casing 246 may include a tubular structure, for example as shown in FIGS. 2*a* and 2*b*.

According to embodiments described herein, a flat coil includes one or more windings. The windings or each winding may be wound substantially within a flat plane, wherein the windings are either in the same flat plane or in parallel flat planes. A flat coil may have a plurality of layers of windings, particularly wherein each layer of windings is provided at least substantially in one of a plurality of parallel flat planes. It should be understood that a winding may be considered as being substantially within a flat plane even if a wire of the winding guides from one plane to another plane or a next plane.

In some embodiments, the flat coils 244 of the two pairs 242 of flat coils can have a substantially rectangular or square shape. In particular, it is understood that a substantially rectangular or square-shaped flat coil may have rounded corners, particularly due to the winding of a wire of the flat coil. The flat coils may be arranged in the deflector such that an edge of a first flat coil of each pair of flat coils is at least substantially parallel to an edge of a second flat coil of the pair of flat coils. In some embodiments, each flat coil of the two pairs of flat coils may have at least one edge, particularly two edges, oriented at least substantially parallel to the axis of the deflector. Each flat coil may have a further edge in a flat plane perpendicular to the axis, and particularly, yet a further edge in a further flat plane perpendicular to the axis. In embodiments, the two pairs of flat coils may be provided by four same-sized flat coils, particularly four identical flat coils. Each pair of flat coils may be arranged with the flat planes of the two flat coils inclined relative to each other. Accordingly, a pair of flat coils may advantageously approximate a saddle shape using flat coils.

In embodiments, the axis 241 of the deflector 240 extends through a region between the two pairs 242 of flat coils, particularly through a central region between the two pairs 242 of flat coils. The axis 241 may be at least substantially parallel to the flat planes of the flat coils 244 of the two pairs 242 of flat coils. The deflector 240 may be configured to be arranged in a charged particle beam apparatus such that the axis 241 is at least substantially parallel to an optical axis of a charged particle beam apparatus.

In some embodiments, the magnetic axes of the flat coils of the two pairs of flat coils are arranged in an at least substantially radial direction with respect to the axis. The magnetic axis of a flat coil extends perpendicular to a flat plane of the flat coil and particularly centrally through the flat coil, more particularly through an opening surrounded by the one or more windings of the flat coil. According to some embodiments, which can be combined with other embodiments, each pair of the two pairs of flat coils includes a first flat coil and a second flat coil. The flat coils of the two pairs of flat coils may be arranged such that the flat planes of the respective first flat coils are at least substantially parallel, and such that the flat planes of the respective second flat coils are at least substantially parallel. In particular, the magnetic axes of the first flat coils may be parallel and particularly, at least substantially collinear, and/or the further magnetic axes of the second flat coils may be parallel and particularly at least substantially collinear. In some embodiments, the axis of the deflector as referred to herein, around which the two pairs of flat coils are arranged, may be perpendicular to the magnetic axes of the flat coils and particularly passing through an intersection point between the magnetic axes of the first flat coils and the second flat coils.

Figure 3:
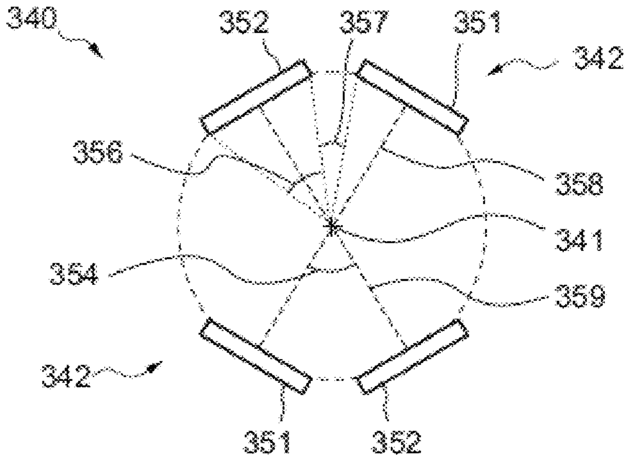
FIG. 3 schematically illustrates an arrangement of flat coils in a deflector according to embodiments of the present disclosure.

For instance, FIG. 3 shows an arrangement of flat coils in a deflector 340 according to embodiments of the present disclosure. The deflector 340 includes two pairs 342 of flat coils, each pair including a first flat coil 351 and a second flat coil 352. The magnetic axes 358 of the first flat coils 351 and the further magnetic axes 359 of the second flat coils 352 are arranged substantially perpendicular to the axis 341 of the deflector. In particular, the axis 341 may pass through the intersection point between the magnetic axes 358 and the further magnetic axes 359.

According to some embodiments, which can be combined with other embodiments described herein, each pair of the two pairs of flat coils includes a first flat coil and a second flat coil. The central positions of the first flat coil and the second flat coil may be arranged at an angular distance of at least 45 degrees in a circumferential direction about the axis, particularly of at least 50 degrees or of at least 55 degrees, and/or at an angular distance of maximum 75 degrees in a circumferential direction about the axis, particularly of maximum 70 degrees or maximum 65 degrees. For example, the first flat coil and the second flat coil may be arranged with their respective central positions at an angular distance of approximately 60 degrees about the axis. Referring to FIG. 3, the first flat coil 351 and the second flat coil 352 of each of the two pairs 342 are arranged with their central positions at an angular distance 354 of 60 degrees in a circumferential direction about the axis 341 of the deflector 340. For instance, the first flat coil 351 and the second flat coil 352 may be arranged at 60 degrees to avoid a hexapole field.

In some embodiments, which can be combined with other embodiments described herein, each flat coil of the two pairs of flat coils extends over an angle interval of at least 30 degrees in a circumferential direction about the axis, particularly at least 40 degrees, at least 45 degrees or at least 50 degrees, and/or over an angle interval of maximum 75 degrees in a circumferential direction about the axis, particularly maximum 70 degrees or maximum 65 degrees. For example, each flat coil may extend over an angle interval of approximately 59 degrees in a circumferential direction about the axis. Referring to FIG. 3, each of the first flat coils 351 and of the second flat coils 352 of the two pairs 342 of flat coils extends over an angle interval 356 of 59 degrees (angles not drawn to scale).

According to embodiments, the first flat coil and the second flat coil are arranged adjacent in a circumferential direction about the axis, specifically in contact with each other. In embodiments, the first flat coil and the second flat coil are spaced apart from each other in a circumferential direction about the axis. In particular, the first flat coil and the second flat coil may be spaced apart from each other in the circumferential direction by less than 10 degrees, particularly less than 5 degrees or less than 3 degrees, and/or by more than 0.5 degrees, particularly more than 0.75 degrees. For instance, the first flat coil and the second flat coil may be spaced apart between 0.5 degrees and 3 degrees, particularly between 1 and 2 degrees. The flat coils may be arranged such that the flat coils are not overlapping in a circumferential direction about the axis. For example, the first flat coil 351 and the second flat coil 352 of a pair 342 of flat coils can be spaced apart in circumferential direction by an angular spacing 357 of approximately 1 degree, for instance as illustrated in FIG. 3 (angles not drawn to scale). In some embodiments, the first coil and the second coil may be spaced apart approximately 1 mm.

In some embodiments, the flat coils of the two pairs of flat coils may be arranged symmetrically around a central axis. In further embodiments, which can be combined with other embodiments of the present disclosure, the two pairs of flat coils are arranged on opposite sides about a central axis of the two pairs of flat coils, wherein the flat coils of the two pairs of flat coils are arranged asymmetrically with respect to the central axis. Additionally or alternatively, the flat coils may be arranged with reflectional asymmetry with respect to a plane along the central axis, and/or may be arranged centrally asymmetric with respect to a central point of the flat coils. In embodiments, one or more flat coils may be displaced by a radial displacement ΔR relative to a symmetric arrangement around a central axis. In an example, the radial displacement may be less than 2 mm, particularly less than 1.5 mm or less than 1.3 mm, and/or more than 0.1 mm, particularly more than 0.2 mm or more than 0.5 mm. In particular, radial distances of the flat coils from the central axis may be different. An asymmetric arrangement of the flat coils may be used to compensate an astigmatism of a charged particle beam. In particular, astigmatism correction may be improved with respect to deflectors with other types of coils such as saddle coils or toroidal coils. More specifically, flat coils of the two pairs of flat coils may be displaced individually with respect to a central axis to compensate astigmatism. A compensation (or correction) of astigmatism by the arrangement of flat coils of a deflector described herein may be understood as a pre-compensation (or pre-correction) of astigmatism to reduce the astigmatism in an electron beam column. The total astigmatism of an electron beam provided by the electron beam column may depend for example on the used deflection and/or on an operation mode. In addition to a deflector or a deflecting system described herein, an electron beam column according to embodiments can include a stigmator, such as a conventional stigmator, in order to finely correct the astigmatism. In embodiments, the radial displacement ΔR may vary for different electron beam columns. For instance, the radial displacement may depend on the amount of deflection to be provided by an electron beam column.

In some embodiments, two flat coils of the two pairs of flat coils may be displaced by a radial displacement ΔR towards the axis, wherein the two flat coils are neighboring flat coils in a circumferential direction about the axis and belong to different pairs of the two pairs of flat coils. The other two flat coils of the two pairs of flat coils may be displaced by a radial displacement ΔR away from the axis. In particular, an asymmetric arrangement may introduce a quadrupole component into the magnetic field of the deflector. A quadrupole component may be provided to compensate an astigmatism.

Figure 4:
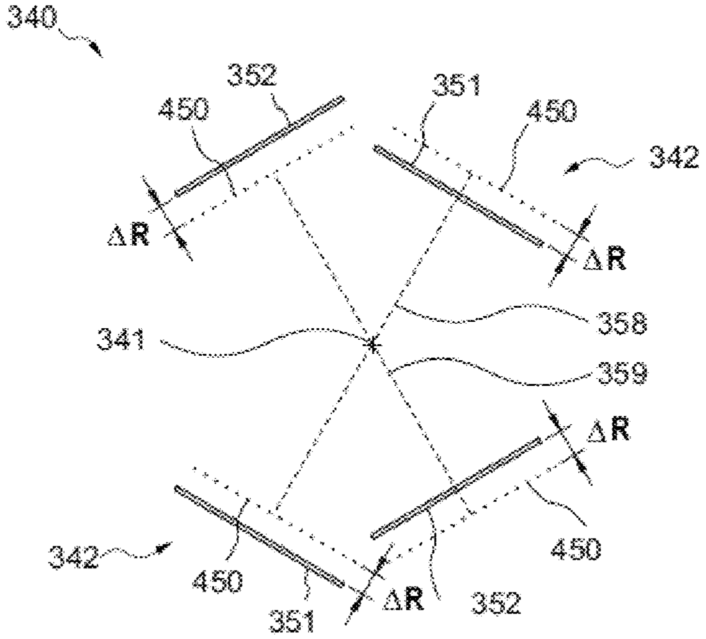
FIG. 4 schematically illustrates a further arrangement of flat coils in a deflector according to embodiments described herein.

For example, FIG. 4 shows an asymmetric arrangement of the first flat coils 351 and second flat coils 352 with respect to the axis 341. In particular, in the illustrated image plane perpendicular to the axis 341, the flat coils are arranged in a point-asymmetric manner with respect to the point of intersection of the image plane of FIG. 4 and the axis 341. As compared to a symmetric arrangement (dotted lines 450 in FIG. 4), in each of the two pairs 342 of flat coils, one of the flat coils is displaced by a radial displacement ΔR towards the axis 341, and the other one of the flat coils is displaced by the radial displacement ΔR away from the axis 341. The asymmetric arrangement introduces a quadrupole component into the magnetic field of the deflector 340. It is understood that in further embodiments, not all the flat coils of a deflector may be positioned with a radial displacement with respect to the axis 341. For instance, in some embodiments, only two flat coils of the deflector may be radially displaced with respect to the axis.

According to embodiments, a distance of each flat coil of the two pairs of coils from the axis of the deflector is more than 18 mm, particularly more than 19 mm, and/or less than 30 mm, particularly less than 27 mm or less than 25 mm. For example, a distance of the flat coils from the axis of the deflector may be approximately 21 mm, particularly plus or minus an individual displacement of the flat coils. Positioning the flat coils at radial distances as described herein may provide a homogeneous magnetic field of the deflector. In further embodiments, the distance of each flat coil of the two pairs of coils from the axis of the deflector may be less than 18 mm.

In embodiments, the deflector is a one-dimensional deflector. In particular, the deflector may be configured to deflect a charged particle beam in a direction perpendicular to the axis of the deflector. Specifically, the deflector may be configured to deflect the charged particle beam in an X-direction perpendicular to the axis (Z-axis) of the deflector. Depending on the electrical charge of the charged particles of a charged particle beam, the travel direction of the charged particles, and the direction of an electrical current through the flat coils of the deflector, the deflector may be configured for deflecting a charged particle beam in +X direction or in −X direction.

Deflectors according to embodiments may be are easier to produce, particularly in view of an easier fabrication of flat coils as compared to saddle coils or toroidal coils. Specifically, flat coils may be produced with fewer fabrication steps and/or within lower tolerances. As compared to the magnetic field provided by a saddle coil, the arrangement of a pair of flat coils according to embodiments may advantageously allow for an individual arrangement of flat coils, particularly an asymmetric arrangement, which may particularly be used for astigmatism compensation. Embodiments may provide improved matching between manufactured charged particle beam apparatuses as tolerances in the deflectors can be reduced. Embodiments may reduce adjustments with respect to matching of charged particle beam apparatuses, and thus provide easier manufacturing of charged particle beam apparatuses. Further, costs of deflectors based on flat coils may be lower than costs of deflectors based on saddle coils or other types of coils.

According to embodiments of the present disclosure, a deflecting system for a charged particle beam apparatus is provided. The deflecting system can be configured for deflecting a charged particle beam of the charged particle beam apparatus relative to an optical axis, the deflecting system including a plurality of deflectors according to embodiments described herein. In some embodiments, deflector of the deflecting system may be configured as a beam separator to separate a primary charged particle beam from a signal charged particle beam.

In some embodiments, the plurality of deflectors of the deflecting system includes at least four deflectors arranged along the optical axis, particularly exactly four deflectors according to embodiments described herein, specifically four magnetic deflectors. In embodiments, the plurality of deflectors includes a first deflector, a second deflector, a third deflector and a fourth deflector arranged in this order along the optical axis. The first deflector is configured to be arranged closest to a charged particle beam source configured to generate a primary charged particle beam of a charged particle beam apparatus. The fourth deflector may be configured to be arranged closest to a sample stage of the charged particle beam apparatus. In particular, the fourth deflector may be configured as a beam separator. According to some embodiments, each deflector of the plurality of deflectors is arranged with the respective axis of the deflector at least substantially parallel to the optical axis of the deflecting system. In particular, the flat coils of the deflectors may have their magnetic axes arranged at least substantially perpendicularly to the optical axis of the deflecting system.

Figure 5:
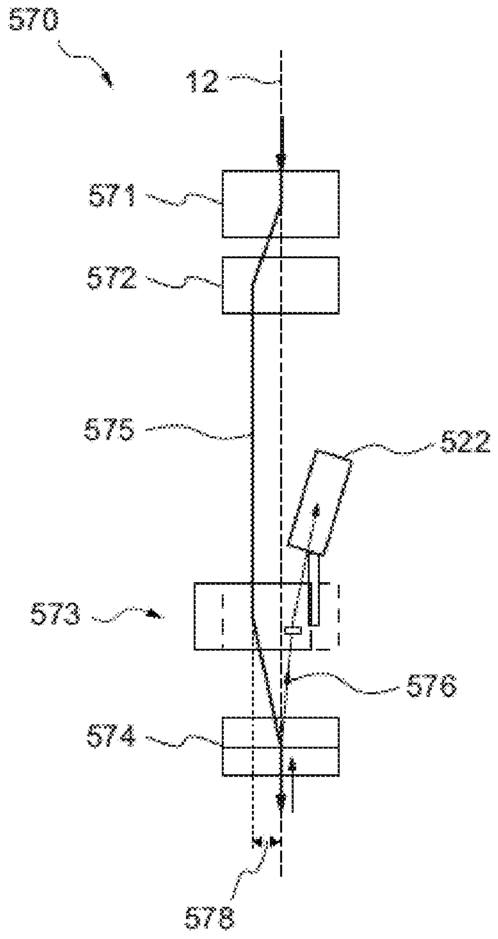
FIG. 5 schematically illustrates a deflecting system with a plurality of deflectors according to embodiments of the present disclosure.

For example, FIG. 5 illustrates a deflecting system 570 configured for deflecting a charged particle beam relative to an optical axis 12 of the deflecting system 570. The deflecting system 570 includes a first deflector 571, a second deflector 572, a third deflector 573 and a fourth deflector 574 arranged in this order along the optical axis 12. The deflecting system 570 is configured to deflect a primary charged particle beam along a primary charged particle beam path 575. Further, the fourth deflector 574 is configured as a beam separator such that a signal charged particle beam path 576 is directed away from the primary charged particle beam path 575, particularly for detection by an off-axis detector 522.

According to some embodiments, the plurality of deflectors may be at least substantially arranged such that their axes are aligned with the optical axis of the deflecting system. In further embodiments, the third deflector may be arranged such that the axis of the third deflector, particularly a central axis of the third deflector, is offset or shifted in a direction perpendicular to the optical axis. In particular, the third deflector may be offset with respect to at least one of the first deflector, the second deflector, and the fourth deflector. In embodiments, the offset may be more than 1 mm, particularly more than 2 mm or more than 3 mm, and/or less than 15 mm, particularly less than 10 mm, for instance approximately 6 mm. The offset of the third deflector may be in the direction of a primary beam deflection provided by the first deflector and the second deflector. Shifting the third deflector may provide a more homogeneous magnetic field for the primary charged particle beam at the third deflector.

In some embodiments, the first deflector, the second deflector and/or the fourth deflector may be arranged such that their respective axes are at least substantially aligned with the optical axis. For example, in FIG. 5, the first deflector 571, the second deflector 572 and the fourth deflector 574 are aligned with the optical axis 12 of the deflecting system 570. The third deflector 573 is arranged with an offset 578 in the direction of the primary beam deflection provided by the first deflector 571 and the second deflector 572.

According to some embodiments, the two pairs of flat coils of the fourth deflector include four flat coils arranged asymmetrically about the axis of the fourth deflector. The asymmetric arrangement may be provided according to embodiments described herein, particularly with a radial displacement ΔR with respect to the axis of the fourth deflector. The asymmetric arrangement may be provided such that an astigmatism of the primary charged particle beam is corrected at the fourth deflector.

Figure 6:
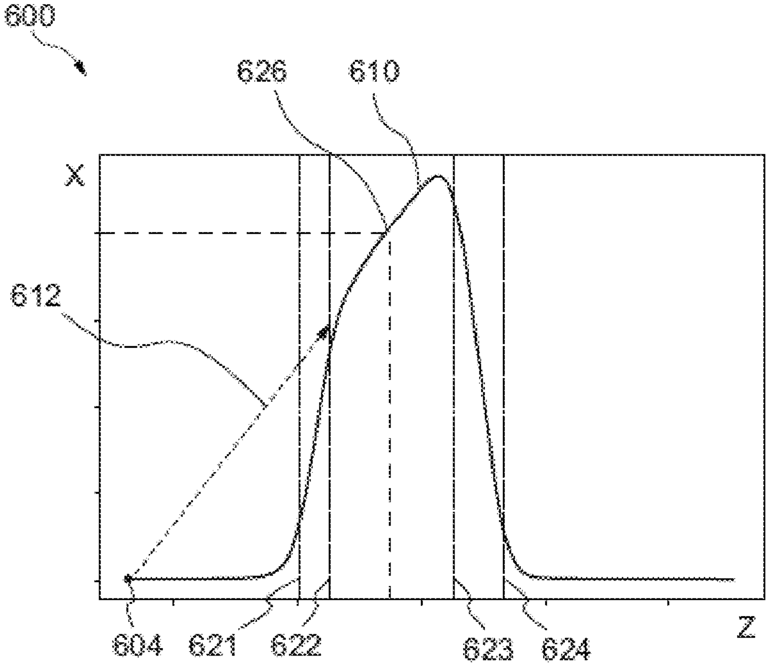
FIG. 6 shows a graph illustrating a beam deflection along an optical axis using a deflecting system according to embodiments of the present disclosure.

FIG. 6 shows a graph 600 illustrating a primary beam deflection 610 by a deflecting system as schematically illustrated in FIG. 5. The graph 600 illustrates the deflection of the primary beam, specifically an electron beam, from a charged particle beam source 604 (left) towards a sample (right). The deflection is shown in X direction along the optical axis (Z axis), wherein the X direction is a direction perpendicular to the optical axis. The graph 600 particularly shows positions 621, 622, 623 and 624 of the first deflector, the second deflector, the third deflector and the fourth deflector, respectively.

According to some embodiments and as particularly illustrated in FIG. 6, the first deflector and the second deflector can be configured to deflect the charged particle beam away from the optical axis. The third deflector and the fourth deflector may be configured to deflect the charged particle beam towards the optical axis or to align the charged particle beam with the optical axis. In FIG. 6, arrow 612 illustrates an apparent beam path from the charged particle beam source 604 to a midway point 626 between the positions 622, 623 of the second deflector and the third deflector. In some embodiments, deflecting the primary charged particle beam such that the beam appears to come from the charged particle beam source can be advantageous for a beam adjustment in the column of a charged particle beam apparatus. Deflecting systems as described herein, using flat coils, may advantageously provide low astigmatism and/or a small virtual spot size of the charged particle beam, particularly even when deflecting the charged particle beam by a larger amount than in conventional systems.

According to embodiments of the present disclosure, a charged particle beam apparatus is provided, including a deflecting system as described herein. The deflecting system may be arranged in the column of a charged particle beam apparatus, particularly between a charged particle beam source and an objective lens of the column. The charged particle beam apparatus may include any of the further features described herein, particularly features of a charged particle beam apparatus described in connection with FIG. 1.

Figure 7:
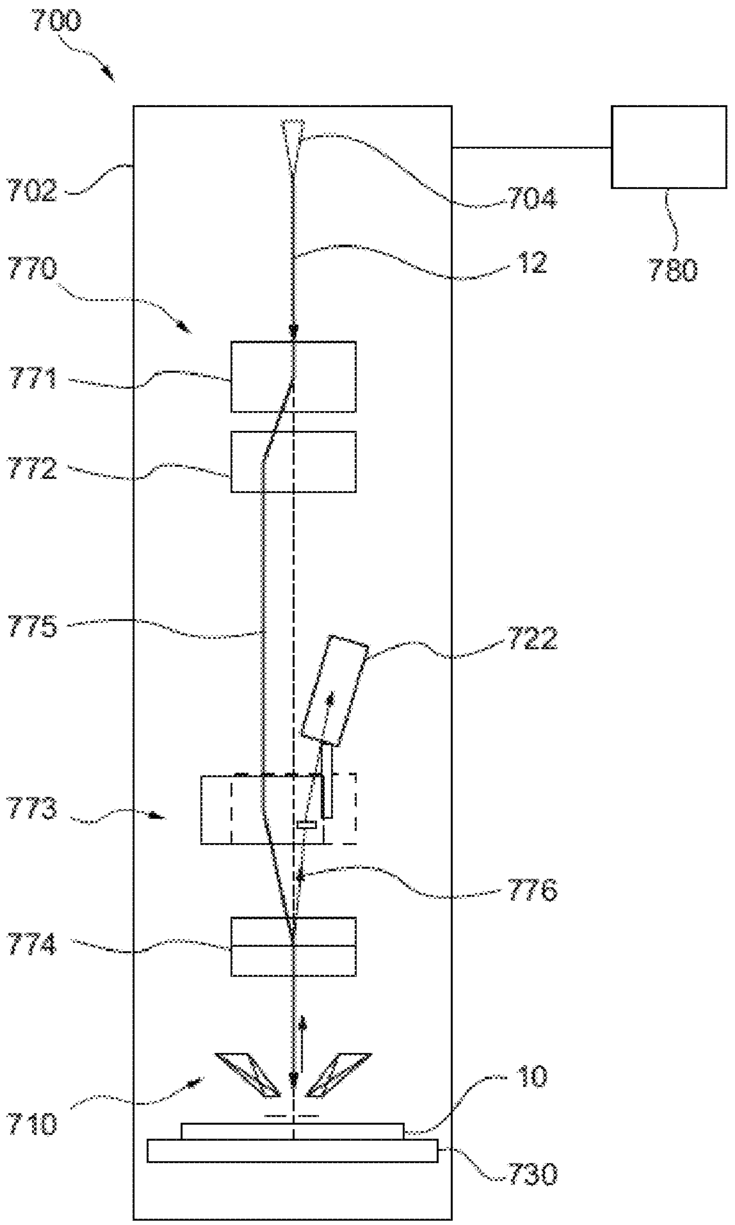
FIG. 7 shows a schematic view of a charged particle apparatus with a deflecting system according to embodiments described herein.

FIG. 7 illustrates a charged particle beam apparatus 700 with a column 702, having a deflecting system 770 as shown in FIG. 5 arranged along the optical axis 12 of the charged particle beam apparatus 700. Specifically, the deflecting system 770 with a first deflector 771, a second deflector 772, a third deflector 773 and a fourth deflector 774 is arranged between the charged particle beam source 704 and an objective lens 710 of the charged particle beam apparatus 700. The fourth deflector 774 acts as beam separator to separate a primary charged particle beam 775 from a signal charged particle beam 776. The signal charged particle beam 776, coming from a sample 10 placed on a sample stage 730, is directed by the fourth deflector 774 and the third deflector 773 to an off-axis detector 722. It should be understood that the charged particle beam apparatus 700 may include further components described herein, such as an on-axis detector, wherein such further components are omitted in FIG. 7 for clarity.

According to some embodiments, which can be combined with other embodiments described herein, a charged particle beam apparatus can include a controller with a processor and a memory storing instructions that when executed by the process, cause the apparatus and particularly, a deflecting system to operate according to any of the embodiments described herein. For example, the charged particle beam apparatus may be controlled to image and/or inspect a sample. In some embodiments, the plurality of deflectors of a deflecting system of the apparatus may be operated and/or controlled individually. In further embodiments, two or more deflectors of the plurality of deflectors of the deflecting system may be controlled together, particularly a current through the two or more deflectors. For instance, in a deflecting system according to embodiments, the first deflector and the second deflector may be controlled together, and/or the third deflector and fourth deflector may be controlled together.

The controller 780 exemplarily shown in FIG. 7, controls the operation of the charged particle beam apparatus 700 and particularly of the deflecting system 770. The controller 780 may include a central processing unit (CPU), a memory and, for example, support circuits. To facilitate control of the charged particle beam apparatus, and particularly to control the deflecting system 770, the CPU may be one of any form of general-purpose computer processor that can be used for controlling various SEM components. The memory is coupled to the CPU. The memory, or a computer readable medium, may be one or more readily available memory devices such as random-access memory, read only memory, hard disk, or any other form of digital storage either local or remote. The support circuits may be coupled to the CPU for supporting the processor in a conventional manner. The circuits include cache, power supplies, clock circuits, input/output circuitry and related subsystems, and the like. Inspecting process instructions are generally stored in the memory as a software routine typically known as a recipe. The software routine may also be stored and/or executed by a second CPU that is remotely located from the hardware being controlled by the CPU. The software routine, when executed by the CPU, transforms the general-purpose computer into a specific purpose computer (controller) that controls the apparatus operation, particularly such that control of the deflecting system of the apparatus can be provided. Although operations by the controller may be discussed as being implemented as a software routine, some of the operations may be performed in hardware as well as by the software controller. As such, the operations may be implemented in software as executed upon a computer system, and hardware as an application specific integrated circuit or other type of hardware implementation, or a combination of software and hardware.

According to embodiments of the present disclosure, a method of fabricating a deflector for a charged particle beam apparatus is provided. The method includes arranging four flat coils as two pairs of flat coils of the deflector around an axis of the deflector, wherein the two pairs of flat coils are arranged on opposite sides about the axis. The four flat coils may be arranged in accordance with embodiments described herein. The arranged flat coils may form a deflector according to embodiments of the present disclosure. In some embodiments, the four flat coils may be arranged symmetrically about the axis.

In further embodiments, arranging the four flat coils includes arranging the four flat coils asymmetrically about the axis. In particular, the method may include determining an astigmatism to be corrected by the deflector. The astigmatism to be corrected may be an astigmatism introduced by devices generating and/or interacting with the charged particle beam in a column of a charged particle beam apparatus, for instance further deflectors to be arranged along the primary beam path before the deflector. Additionally or alternatively, the astigmatism to be corrected may include an astigmatism introduced by the deflector itself. The astigmatism to be corrected may for example be determined via a measurement such as a measurement in a charged particle beam apparatus, and/or via a simulation, such as ray-tracing of a plurality of trajectories through a column of a charged particle beam apparatus or through a deflecting system such as a deflecting system described herein. The method may further include determining positions and particularly orientations of the four flat coils relative to the axis to correct the determined astigmatism. For instance, the positions and/or orientations may be determined via measurements and/or simulations. The four flat coils may be arranged at the determined positions and particularly with the determined orientations to at least partially correct the astigmatism.

Figure 8:
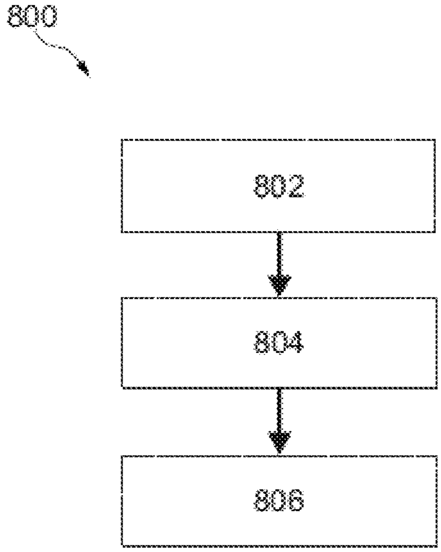
FIG. 8 shows a flow chart illustrating a method of fabricating a deflector according to embodiments of the present disclosure.

For instance, FIG. 8 illustrates a flow diagram of a method 800 of fabricating a deflector. At 802, an astigmatism to be corrected by the deflector may be determined. At 804, positions and orientations of four flat coils in two pairs arranged on opposite sides about an axis may be determined such that the deflector can at least partially correct the determined astigmatism. At 806, the four flat coils are arranged as two pairs of flat coils around the axis of the deflector on opposite sides about the axis. In particular, the four flat coils may be positioned and oriented according to the determined positions and orientations to at least partially correct the determined astigmatism.

In some embodiments, the fabricated deflector may be used in a method of fabricating a deflecting system, particularly a deflecting system according to embodiments described herein. A deflector fabricated to correct an astigmatism may be particularly used as a fourth deflector in a deflector system as described herein. In some embodiments, the fabricated deflecting system may be used in a method of fabricating a charged particle beam apparatus, particularly a charged particle beam apparatus according to embodiments described herein.

In a further aspect of the present disclosure, a deflecting system for a charged particle beam apparatus, and a charged particle beam apparatus including such a deflecting system are provided. The deflecting system may be configured for deflecting a charged particle beam of the charged particle beam apparatus relative to an optical axis of the charged particle beam apparatus. In embodiments, the deflecting system includes at least four deflectors, particularly exactly four deflectors. In embodiments, the deflectors are magnetic deflectors. The deflectors include a first deflector, a second deflector, a third deflector and a fourth deflector, wherein the deflectors are particularly arranged in this order between a charged particle beam source and an objective lens of the charged particle beam apparatus. The deflectors according to this aspect are particularly not limited to deflectors including flat coils as described herein, but may additionally or alternatively include for example one or more deflectors with saddle coils or with one or more other types of coils. The deflecting system and charged particle beam apparatus according to this aspect may include any of the further features of deflecting systems or charged particle beam apparatuses of the present disclosure. The arrangement of deflectors as described for this aspect may be combined with other aspects and embodiments of deflecting systems or charged particle beam apparatuses of the present disclosure.

According to embodiments, each of the first deflector, the second deflector, the third deflector and the fourth deflector has an axis in accordance with embodiments described herein. In embodiments, the first deflector, the second deflector and the fourth deflector are arranged coaxially with the optical axis of the charged particle beam apparatus. In embodiments, the third deflector is positioned with the deflector axis arranged off-axis with respect to the optical axis, particularly with the deflector axis of the third deflector offset relative to the optical axis. In particular, only the third deflector of the at least four deflectors may be arranged offset with respect to the optical axis. The deflector axis of the third deflector May be oriented parallel to the optical axis. The arrangement of the at least four deflectors and particularly the offset of the third deflector may be provided in accordance with other embodiments of deflecting systems or charged particle beam apparatuses described herein, for instance as described in connection with FIGS. 5 to 7. In particular, the offset of the third deflector may be provided in a direction perpendicular to the optical axis. The offset may be more than 1 mm, particularly more than 2 mm or more than 3 mm, and/or less than 15 mm, particularly less than 10 mm, for instance approximately 6 mm. The first deflector and the second deflector may be configured to deflect the primary charged particle beam at least substantially towards a central region of the third deflector. The offset of the third deflector may provide a homogeneous magnetic field for deflecting the primary charged particle beam at the third deflector.

Embodiments of the present disclosure may particularly provide advantages in the manufacturing and/or operation of deflectors, deflecting systems and charged particle beam apparatuses. For instance, flat coils may allow for an easier manufacturing of deflectors as compared to deflectors using other types of coils. In particular, flat coils may be fabricated accurately with low tolerances. Costs of manufacturing may be reduced. The use of two pairs of flat coils can provide flexibility in the positioning of the flat coils, particularly by individual placement of the flat coils. For instance, flat coils may be advantageously positioned to precompensate astigmatism. Additionally or alternatively, the coils of the deflectors may be positioned to provide improved field homogeneity. Embodiments may provide improved matching of charged particle beam apparatuses in manufacturing. Further, embodiments described herein may provide improved performance of beam separation and/or charged particle beam characteristics, for instance with respect to astigmatism and/or virtual spot size.

In the present disclosure, a plurality of embodiments is described, which include inter alia the following embodiments.

Embodiment 1. A deflector for a charged particle beam apparatus, the deflector having an axis and being configured to deflect a charged particle beam in a direction perpendicular to the axis, the deflector comprising: a plurality of flat coils comprising two pairs of flat coils, wherein the two pairs of flat coils are arranged on opposite sides about the axis of the deflector.

Embodiment 2. The deflector of embodiment 1, wherein each pair of the two pairs of flat coils comprises a first flat coil and a second flat coil, wherein central positions of the first flat coil and the second flat coil are arranged at an angular distance of at least one of: at least 45 degrees in a circumferential direction about the axis, and an angular distance of maximum 75 degrees in a circumferential direction about the axis.

Embodiment 3. The deflector of embodiment 1 or 2, wherein each flat coil of the two pairs of flat coils extends over at least one of an angle interval of at least 30 degrees in a circumferential direction about the axis, and an angle interval of maximum 75 degrees in a circumferential direction about the axis.

Embodiment 4. The deflector of any of embodiments 1 to 3, wherein the first flat coil and the second flat coil are arranged adjacent to each other, or are spaced apart from each other in a circumferential direction about the axis by less than 10 degrees.

Embodiment 5. The deflector of any of embodiments 1 to 4, wherein the deflector is a one-dimensional deflector.

Embodiment 6. The deflector of any of embodiments 1 to 5, wherein magnetic axes of the flat coils of the two pairs of flat coils are arranged in an at least substantially radial direction with respect to the axis.

Embodiment 7. The deflector of any of embodiments 1 to 6, wherein the two pairs of flat coils are arranged on opposite sides about a central axis of the two pairs of flat coils, and wherein the flat coils of the two pairs of flat coils are arranged asymmetrically with respect to the central axis.

Embodiment 8. The deflector of any of embodiments 1 to 7, wherein a distance of each flat coil of the two pairs of coils from the axis is more than 18 mm.

Embodiment 9. A deflecting system for a charged particle beam apparatus, the deflecting system configured for deflecting a charged particle beam of the charged particle beam apparatus relative to an optical axis, the deflecting system comprising a plurality of deflectors of any of embodiments 1 to 8.

Embodiment 10. The deflecting system of embodiment 9, wherein the plurality of deflectors comprises a first deflector, a second deflector, a third deflector and a fourth deflector arranged in this order along the optical axis, wherein the first deflector is configured to be arranged closest to a charged particle beam source configured to generate a primary charged particle beam of the charged particle beam apparatus, and wherein the fourth deflector is configured to be arranged closest to a sample stage of the charged particle beam apparatus.

Embodiment 11. The deflecting system of embodiment 10, wherein the third deflector is arranged such that the axis of the third deflector is offset in a direction perpendicular to the optical axis with respect to at least one of the first deflector, the second deflector, and the fourth deflector.

Embodiment 12. The deflecting system of embodiment 11, wherein the axes of the first deflector, the second deflector and the fourth deflector are at least substantially aligned with the optical axis.

Embodiment 13. The deflecting system of any of embodiments 10 to 12, wherein the two pairs of flat coils of the fourth deflector comprise four flat coils arranged asymmetrically about the axis of the fourth deflector.

Embodiment 14. A charged particle beam apparatus comprising the deflecting system of any of embodiments 9 to 13.

Embodiment 15. A method of fabricating a deflector for a charged particle beam apparatus, comprising:

arranging four flat coils as two pairs of flat coils of the deflector around an axis of the deflector, wherein the two pairs of flat coils are arranged on opposite sides about the axis.

Embodiment 16. The method of embodiment 15, wherein arranging the four flat coils comprises arranging the four flat coils asymmetrically about the axis.

While the foregoing is directed to embodiments, other and further embodiments may be devised without departing from the basic scope, and the scope thereof is determined by the claims that follow.

What we claim is:

1. A deflector for a charged particle beam apparatus, the deflector having an axis and being configured to deflect a charged particle beam in a direction perpendicular to the axis, the deflector comprising:

a plurality of flat coils comprising two pairs of flat coils, wherein the two pairs of flat coils are arranged on opposite sides about the axis of the deflector, wherein the two pairs of flat coils are arranged on opposite sides about a central axis of the two pairs of flat coils, wherein the flat coils of the two pairs of flat coils are arranged asymmetrically with respect to the central axis, and wherein, in an image plane perpendicular to the axis, the flat coils are arranged in a point-asymmetric manner with respect to the point of intersection of the image plane and the axis.

2. The deflector of claim 1, wherein each pair of the two pairs of flat coils comprises a first flat coil and a second flat coil, wherein central positions of the first flat coil and the second flat coil are arranged at an angular distance of at least one of: at least 45 degrees in a circumferential direction about the axis, and maximum 75 degrees in a circumferential direction about the axis.

3. The deflector of claim 1, wherein each flat coil of the two pairs of flat coils extends over at least one of an angle interval of at least 30 degrees in a circumferential direction about the axis, and an angle interval of maximum 75 degrees in a circumferential direction about the axis.

4. The deflector of claim 1, wherein each pair of the two pairs of flat coils comprises a first flat coil and a second flat coil, wherein the first flat coil and the second flat coil are arranged adjacent to each other, or are spaced apart from each other in a circumferential direction about the axis by less than 10 degrees.

5. The deflector of claim 1, wherein the deflector is a one-dimensional deflector.

6. The deflector of claim 1, wherein magnetic axes of the flat coils of the two pairs of flat coils are arranged in an at least substantially radial direction with respect to the axis.

7. The deflector of claim 1, wherein a distance of each flat coil of the two pairs of coils from the axis is more than 18 mm.

8. A deflecting system for a charged particle beam apparatus, the deflecting system configured for deflecting a charged particle beam of the charged particle beam apparatus relative to an optical axis, the deflecting system comprising a plurality of deflectors, each deflector of the plurality of deflectors having an axis and being configured to deflect the charged particle beam in a direction perpendicular to the axis, each deflector comprising:

a plurality of flat coils comprising two pairs of flat coils, wherein the two pairs of flat coils are arranged on opposite sides about the axis of the deflector;

wherein the two pairs of flat coils of at least one deflector of the plurality of deflectors are arranged on opposite sides about a central axis of the two pairs of flat coils, wherein the flat coils of the two pairs of flat coils of the at least one deflector are arranged asymmetrically with respect to the central axis, and wherein, in an image plane perpendicular to the axis, the flat coils are arranged in a point-asymmetric manner with respect to the point of intersection of the image plane and the axis.

9. The deflecting system of claim 8, wherein each pair of the two pairs of flat coils comprises a first flat coil and a second flat coil, wherein central positions of the first flat coil and the second flat coil are arranged at an angular distance of at least one of: at least 45 degrees in a circumferential direction about the axis, and maximum 75 degrees in a circumferential direction about the axis.

10. The deflecting system of claim 8, wherein each flat coil of the two pairs of flat coils extends over at least one of an angle interval of at least 30 degrees in a circumferential direction about the axis, and an angle interval of maximum 75 degrees in a circumferential direction about the axis.

11. The deflecting system of claim 8, wherein the plurality of deflectors comprises a first deflector, a second deflector, a third deflector and a fourth deflector arranged in this order along the optical axis, wherein the first deflector is configured to be arranged closest to a charged particle beam source configured to generate a primary charged particle beam of the charged particle beam apparatus, and wherein the fourth deflector is configured to be arranged closest to a sample stage of the charged particle beam apparatus.

12. The deflecting system of claim 11, wherein the third deflector is arranged such that the axis of the third deflector is offset in a direction perpendicular to the optical axis with respect to at least one of the first deflector, the second deflector, and the fourth deflector.

13. The deflecting system of claim 12, wherein the axes of the first deflector, the second deflector and the fourth deflector are at least substantially aligned with the optical axis.

14. The deflecting system of claim 11, wherein the two pairs of flat coils of the fourth deflector comprise four flat coils arranged asymmetrically about the axis of the fourth deflector.

15. A charged particle beam apparatus comprising a deflecting system configured for deflecting a charged particle beam of the charged particle beam apparatus relative to an optical axis, the deflecting system comprising a plurality of deflectors for the charged particle beam apparatus, each deflector of the plurality of deflectors having an axis and being configured to deflect the charged particle beam in a direction perpendicular to the axis, each deflector comprising:

a plurality of flat coils comprising two pairs of flat coils, wherein the two pairs of flat coils are arranged on opposite sides about the axis of the deflector;

wherein the two pairs of flat coils of at least one deflector of the plurality of deflectors are arranged on opposite sides about a central axis of the two pairs of flat coils, wherein the flat coils of the two pairs of flat coils of the at least one deflector are arranged asymmetrically with respect to the central axis, and wherein, in an image plane perpendicular to the axis, the flat coils are arranged in a point-asymmetric manner with respect to the point of intersection of the image plane and the axis.

16. The deflecting system of claim 15, wherein each pair of the two pairs of flat coils comprises a first flat coil and a second flat coil, wherein central positions of the first flat coil and the second flat coil are arranged at an angular distance of at least one of: at least 45 degrees in a circumferential direction about the axis, and maximum 75 degrees in a circumferential direction about the axis.

17. The deflecting system of claim 15, wherein each flat coil of the two pairs of flat coils extends over at least one of an angle interval of at least 30 degrees in a circumferential direction about the axis, and an angle interval of maximum 75 degrees in a circumferential direction about the axis.

18. A method of fabricating a deflector for a charged particle beam apparatus, comprising:

arranging four flat coils as two pairs of flat coils of the deflector around an axis of the deflector, wherein the two pairs of flat coils are arranged on opposite sides about the axis, wherein arranging the four flat coils comprises arranging the four flat coils asymmetrically about the axis, and wherein arranging the four flat coils comprises arranging the four flat coils such that, in an image plane perpendicular to the axis, the four flat coils are arranged in a point-asymmetric manner with respect to the point of intersection of the image plane and the axis.

* * * * *